United States Patent
Yang et al.

(10) Patent No.: US 9,941,996 B2
(45) Date of Patent: Apr. 10, 2018

(54) MESSAGE CODING FOR NCMA-BASED MULTIPLE ACCESS NETWORKS

(71) Applicant: The Chinese University of Hong Kong, Shatin (CN)

(72) Inventors: Shenghao Yang, Ma on Shan (CN); Soung-Chang Liew, Shatin (CN); Lizhao You, Shan Tin (CN); Yi Chen, Ma on Shan (CN)

(73) Assignee: The Chinese University of Hong Kong, Shatin, N.T., Hong Kong SAR (CN)

( * ) Notice: Subject to any disclaimer, the term of this patent is extended or adjusted under 35 U.S.C. 154(b) by 172 days.

(21) Appl. No.: 14/839,708

(22) Filed: Aug. 28, 2015

(65) Prior Publication Data

US 2017/0064701 A1    Mar. 2, 2017

(51) Int. Cl.
*H04L 12/26*  (2006.01)
*H04L 1/00*  (2006.01)
*H03M 13/00*  (2006.01)

(52) U.S. Cl.
CPC .............. *H04L 1/00* (2013.01); *H03M 13/00* (2013.01)

(58) Field of Classification Search
CPC ...................................................... H04L 1/065
See application file for complete search history.

(56) References Cited

U.S. PATENT DOCUMENTS

2015/0049751 A1*  2/2015  Liew ..................... H04L 1/0048
                                               370/338

OTHER PUBLICATIONS

Cocco, "Seek and Decode: Random Multiple Access with Multiuser Detection and Physical-Layer Network Coding," *Communications Workshops (ICC), IEEE International Conference*, pp. 501-506 (2014).

Ghanbarinejad, et al., "Irregular Repetition Slotted ALOHA with Multiuser Detection," *10th Annual Conference on Wireless On-demand Network Systems and Services (WONS)*, pp. 201-205 (2013).

Hansen, et al., "Bridging Inter-flow and Intra-flow Network Coding for Video Applications: Testbed Description and Performance Evaluation," *IEEE 18th International Workshop on Computer Aided Modeling and Design of Communication Links and Networks (CAMAD)*, pp. 7-12, (2013).

(Continued)

*Primary Examiner* — Kevin C Harper
(74) *Attorney, Agent, or Firm* — Kilpatrick Townsend & Stockton LLP (57) ABSTRACT

Computationally efficient message encoding and decoding schemes for NCMA-based multiple access networks are enabled. Belief propagation decoding of fountain codes designed for NCMA-based multiple access networks may be enhanced using Gaussian elimination. Networks utilizing a network-coded slotted ALOHA protocol can benefit in particular. In such cases, Gaussian elimination may be applied locally to solve the linear system associated with each timeslot, and belief propagation decoding may be applied between the linear systems obtained over different timeslots. The computational complexity of such an approach may be of the same order as a conventional belief propagation decoding algorithm. The fountain code degree distribution may be tuned to optimize for different numbers of expected channel users.

20 Claims, 9 Drawing Sheets

(56) References Cited

OTHER PUBLICATIONS

Krigslund, et al., "CORE: COPE with MORE in Wireless Meshed Networks," *IEEE (VTC Spring)*, 6 pages.

Liva, "Graph-Based Analysis and Optimization of Contention Resolution Diversity Slotted ALOHA," *IEEE Transactions on Communications*, vol. 59, No. 2, pp. 477-487 (2011).

Liva, et al., "Spatially-Coupled Random Access on Graphs," *IEEE International Symposium on Information Theory Proceedings*, pp. 478-482 (2012).

Lu, et al., "Network-Coded Multiple Access," *IEEE Transactions on Mobile Computing*, vol. 13, No. 12, pp. 2853-2869 (2014).

Luby, "LT Codes," *Foundations of Computer Science, The 43rd Annual IEEE Symposium on Foundations of Computer Science*, 10 pages (2002).

Narayanan, et al., "Iterative Collision Resolution for Slotted ALOHA: An Optimal Uncoordinated Transmission Policy," *7th International Symposium on Turbo Codes and Iterative Information Processing (ISTC)*, pp. 136-139 (2012).

Paolini, et al., "High Throughput Random Access via Codes on Graphs: Coded Slotted ALOHA," *IEEE ICC Proceedings*, 6 pages (2011).

Puducheri, et al., "The Design and Performance of Distributed LT Codes," *IEEE Transactions on Information Theory*, vol. 53, No. 10, pp. 3740-3754 (2007).

Shokrollahi, "Raptor Codes," *IEEE Transactions on Information Theory*, vol. 52, No. 6, pp. 2551-2567 (2006).

Stefanovic, et al., "Frameless ALOHA Protocol for Wireless Networks," *IEEE Communications Letters*, vol. 16, No. 12, pp. 2087-2090 (2012).

Yang, et al., "Coding for Network-Coded Slotted ALOHA," *Information Theory Workshop (ITW)*, 5 pages (2015)

Yang, et al., "Coding for Network-Coded Slotted ALOHA," arXiv.org, 7 pages (2015).

Yang, et al., "Linearly-Coupled Fountain Codes," *IEEE Information Theory Workshop*, pp. 1-36 (2014).

Yang, et al., "Linearly-Coupled Fountain Codes for Network-Coded Multiple Access," *Information Theory Workshop (ITW)*, 5 pages (2014).

You, et al., "Network-Coded Multiple Access II: Toward Real-Time Operation With Improved Performance," *IEEE Journal on Selected Areas in Communications*, vol. 33, No. 2, pp. 264-280 (2015).

Yu, et al., "High-Throughput Random Access Using Successive Interference Cancellation in a Tree Algorithm," *IEEE Transactions on Information Theory*, vol. 53, No. 12, pp. 4628-4639 (2007).

Zhu, et al., "Multiple Access via Compute-and-Forward," *EEE Transactions on Information Theory*, pp. 1-25.

\* cited by examiner

MESSAGE CODING FOR NCMA-BASED MULTIPLE ACCESS NETWORKS

FIELD OF THE INVENTION

This invention pertains generally to device-facilitated communication and, more particularly, to device-facilitated communication protocols for multiple access communication networks.

BACKGROUND

In a wireless multiple-access network, multiple source nodes (users) may deliver information to a sink node (e.g., a wireless network access point) through a common wireless channel. Each source node may encode its message into one or multiple packets and may transmit these packets over successive timeslots (e.g., sequentially). Transmissions may start at the beginning of a timeslot, and the timeslots may be long enough to complete the transmission of a packet.

Collisions and/or interferences can occur when more than one user transmits in the same timeslot. Traditional approaches for resolving collision include successive interference cancellation (SIC) and multi-user decoding (MUD). More recent approaches, called network-coded multiple access (NCMA), utilize both physical-layer network coding (PNC) and multiuser decoders at the physical layer to obtain linear combinations of the packets simultaneously transmitted in each timeslot. A PNC decoder can successfully recover linear combinations of the packets when the traditional MUD fails.

A typical goal of a multiple-access network is to recover the original (e.g., unencoded) messages of the users, rather than just the linear combinations of the transmitted packets among different users. Message decoding is hence required by NCMA to recover the original messages of the users. Conventional message encoding approaches include Reed-Solomon codes and uniform random linear codes. However, such approaches can result in a corresponding message decoding process that is inefficient, ineffective and/or has undesirable side effects or other drawbacks with respect to at least one significant use case (e.g., the message decoding process may have an impractically high computational complexity).

Embodiments of the invention are directed toward solving these and other problems individually and collectively.

BRIEF SUMMARY

Computationally efficient message encoding and decoding schemes for NCMA-based multiple access networks are enabled. Belief propagation decoding of fountain codes designed for NCMA-based multiple access networks may be enhanced utilizing Gaussian elimination. Networks utilizing a network-coded slotted ALOHA protocol can benefit in particular. In such cases, Gaussian elimination may be applied locally to solve the linear system associated with each timeslot, and belief propagation decoding may be applied between the linear systems obtained over different timeslots. The computational complexity of such an approach may be of the same order as a conventional belief propagation decoding algorithm. The fountain code degree distribution may be tuned to optimize for different numbers of expected channel users.

In accordance with at least one embodiment of the invention, a decoding component of a device (e.g., a computing device such as a wireless network access point) may receive a linear combination of encoded data packets transmitted by senders (e.g., wireless communication devices) in accordance with a fountain code. The decoding component may iteratively apply a multi-stage decoding procedure to the linear combination of the encoded data packets to provide decoded data packets corresponding to each of the senders. The multi-stage decoding procedure may include a first stage during which a belief propagation decoding of the linear combination of the encoded data packets is performed, and a second stage during which the linear combination of the encoded data packets is transformed to enable further applications of the first stage. Among the iterative applications of the multi-stage decoding procedure, the second stage may include a transformation corresponding to a Gaussian reduction of a matrix representing the linear combination of the encoded data packets.

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

BRIEF DESCRIPTION OF THE DRAWINGS

Illustrative embodiments of the present invention are described in detail below with reference to the following drawing figures.

Note that the same numbers are used throughout the disclosure and figures to reference like components and features.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

In accordance with at least one embodiment of the invention, computationally efficient message encoding and decoding schemes for NCMA-based multiple access networks are enabled (e.g., schemes having relatively low computational complexity). Belief propagation decoding of fountain codes designed for NCMA-based multiple access networks may be enhanced using Gaussian elimination. Networks utilizing a network-coded slotted ALOHA protocol can benefit in particular. In such cases, Gaussian elimination may be applied locally to solve the linear system associated with each timeslot, and belief propagation decoding may be applied between the linear systems obtained over different timeslots. The computational complexity of such an approach may be of the same order as a conventional BP decoding algorithm. The fountain code degree distribution may be tuned to optimize for different numbers of expected channel users.

Consider a multiple-access network with L users, each of which has K input packets. Two illustrative coding approaches are described below. A first approach (generic batched belief propagation decoding for linearly-coupled fountain codes) is suitable for the case that K is relatively large; while a second approach (a special case of batched belief propagation decoding for network-coded ALOHA environments) is designed for the case that K=1 and L is relatively large.

Fountain codes (e.g., LT codes and Raptor codes) were originally introduced for erasure channels and have the advantages of ratelessness and low encoding/decoding complexity. In accordance with at least one embodiment of the invention, a digital fountain approach may be utilized for NCMA, where each user encodes its K input packets using a fountain code. These linear combinations decoded by the physical layer of the sink node over a number of timeslots are sometimes herein collectively called a linearly-coupled fountain (LCF) code.

A conventional belief propagation (BP) decoding algorithm of fountain codes may be inefficient for LCF codes (e.g., non-optimal for more than two users). In accordance with at least one embodiment of the invention, a batched BP decoding algorithm may be utilized which processes the linear combinations decoded from the same timeslot jointly. In accordance with at least one embodiment of the invention, the decoding complexity of batched BP decoding is of $O(LK(\tilde{L}^2+LT))$ finite-field operations, where $\tilde{L} \leq L$ is the maximum number of linearly independent combinations that can be decoded by the physical-layer for a single timeslot, and where T is the number of field symbols in a packet.

Batched BP decoding may incorporate and/or be based at least in part on conventional BP decoding and a local Gaussian elimination. Degree distributions (e.g., with respect to degree of code word redundancy) of conventional fountain codes designed for a single-user erasure channel may be far from optimal for LCF codes. A geometric analysis of the convergence of the batched BP decoding may be utilized to define optimization problems for degree distributions for LCF codes.

For a special case, consider an L-user network-coded slotted ALOHA (NCSA) system, where each user has an input packet to be delivered over a frame of timeslots. As used herein, the term 'ALOHA' refers to the ALOHA class of multiple access communication systems and/or protocols well known to those of skill in the art. In NCSA, a packet is a smallest transmission unit, which is not further separated into multiple smaller transmission units. However, it is allowed to send multiple copies of a packet in different timeslots. The number of copies of the packet, sometimes called the degree, may be independently sampled from a degree distribution. The linear equations decoded by the physical layer in a timeslot as part of NCMA form a system of linear equations. Different systems of linear equations are recovered in different timeslots. To recover the input packets of users, a message decoder may be utilized to jointly solve these systems of linear equations obtained over different timeslots. In accordance with at least one embodiment of the invention, Gaussian elimination may be applied locally to solve the linear system associated with each timeslot, and BP may be applied between the linear systems obtained over different timeslots. The computational complexity of such an approach may be of the same order as a conventional BP decoding algorithm. Degree distribution may be optimized as the number of expected users L becomes larger based at least in part on an asymptotic performance of the batched BP decoding algorithm.

Figure 1:
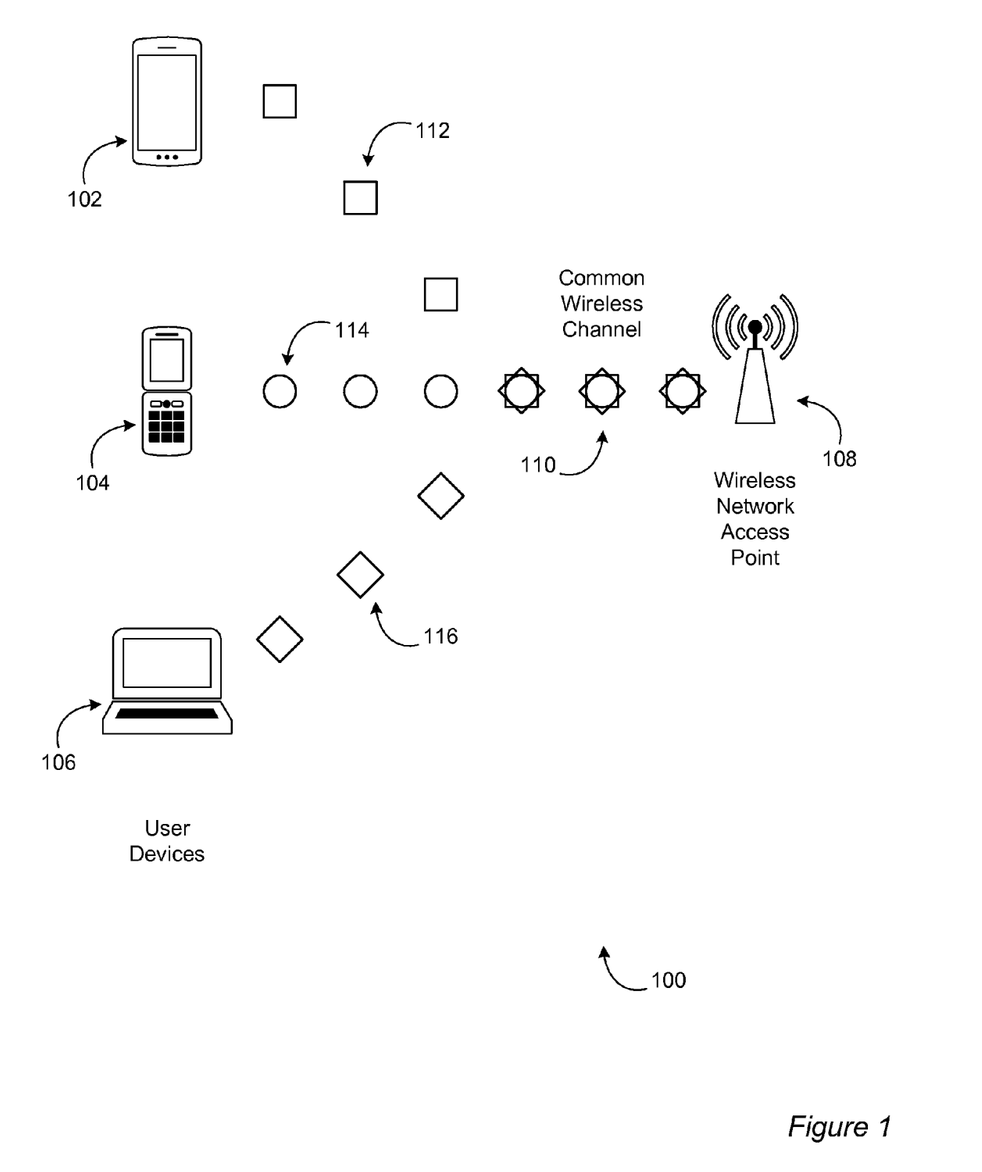
FIG. 1 is a schematic diagram depicting aspects of an example communication environment in accordance with at least one embodiment of the invention.

FIG. 1 depicts aspects of an example communication environment 100 in accordance with at least one embodiment of the invention. In the example communication environment, multiple source nodes (e.g., user devices 102, 104, 106) communicate with a sink node (e.g., a wireless network access point 108) over a common communication channel (e.g., a common wireless communication channel 110). The user devices may include any suitable communication device including suitable network enabled computing devices such as wireless communication devices, wireless phones, cell phones, mobile phones, smart phones, tablet class computing devices, laptop class computing devices, wearable computing devices, personal computers and computers. The environment may include any suitable number of user devices As depicted in FIG. 1, the packets 112, 114, 116 broadcast by the different user devices may collide and/or interfere (e.g., become superimposed) in the common communication channel. Although wireless communication environments, systems and components are used herein for clarity, one of skill in the art will appreciate that each embodiment of the invention is not so limited, and that message coding in accordance with at least one embodiment of the invention may be utilized in any suitable NCMA-based multiple access network including in wireline communication environments. In FIG. 1, different shapes 112, 114, 116 are used to indicated different data packet streams that combine in the common wireless communication channel 110. For example, the different data packet streams 112, 114, 116 may be encoded utilizing one or more fountain codes.

Figure 2:
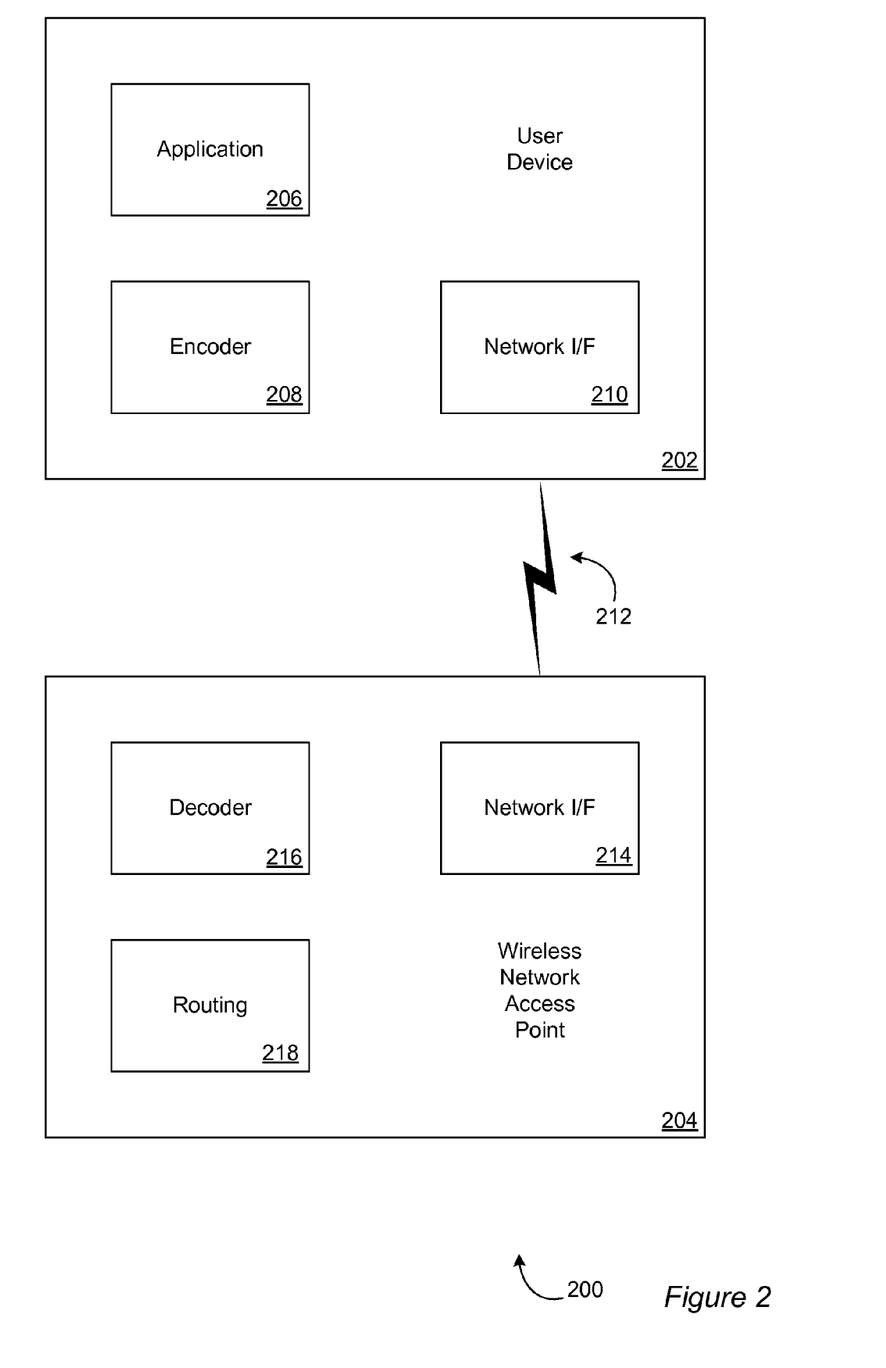
FIG. 2 is a schematic diagram depicting aspects of an example system architecture in accordance with at least one embodiment of the invention.

FIG. 2 depicts aspects of an example system architecture 200 in accordance with at least one embodiment of the invention. The example system architecture includes a user device 202 communicating with a wireless network access point 204. The user device and wireless network access point of FIG. 2 are examples of the source nodes (sometimes called senders) and sink nodes (sometimes called receivers) depicted in FIG. 1. The user device and/or the wireless network access point may be any suitable device capable of participating in message coding and/or decoding as described herein including a device incorporating one or more circuits such as electronic circuits, optical circuits, analog circuits, digital circuits, integrated circuits ("ICs", sometimes called "chips") including application-specific ICs ("ASICs") and field-programmable gate arrays ("FPGAs"), and suitable combinations thereof, a computing device (e.g., incorporating one or more computer processors and/or CPUs) and/or a computer system (e.g., incorporating one or more computing devices). The user device includes an application module and/or component (collectively "component") 206 implementing a communication application such as audio communication, video communication, text-based communication, digital media communication including streams of digital media and suitable combinations thereof. The application component 206 may generate messages for communication. An encoder 208 may encode the messages for transmission as encoded packets in accordance with at least one embodiment of the invention, and a network interface 210 may transmit 212 the encoded packets to a corresponding network interface 214 at the wireless network access point 204. The network interface of the wireless network access point may forward the received packets to a decoder 216 (e.g., a decoding component of the wireless network access point). In accordance with at least one embodiment of the invention, the decoder may efficiently decode the encoded packets received from the user device, and forward the decoded packets and/or the corresponding messages generated by the application of the user device to a routing component 218 for routing to one or more destinations of the messages. Alternatively, or in addition, the wireless network access point may correspond to another user device and the decoder may provide the decoded messages to an application for presentation to a user.

The description now turns to encoding and decoding schemes that may be implemented by the encoder and/or decoder components in accordance with at least one embodiment of the invention.

Figure 3:
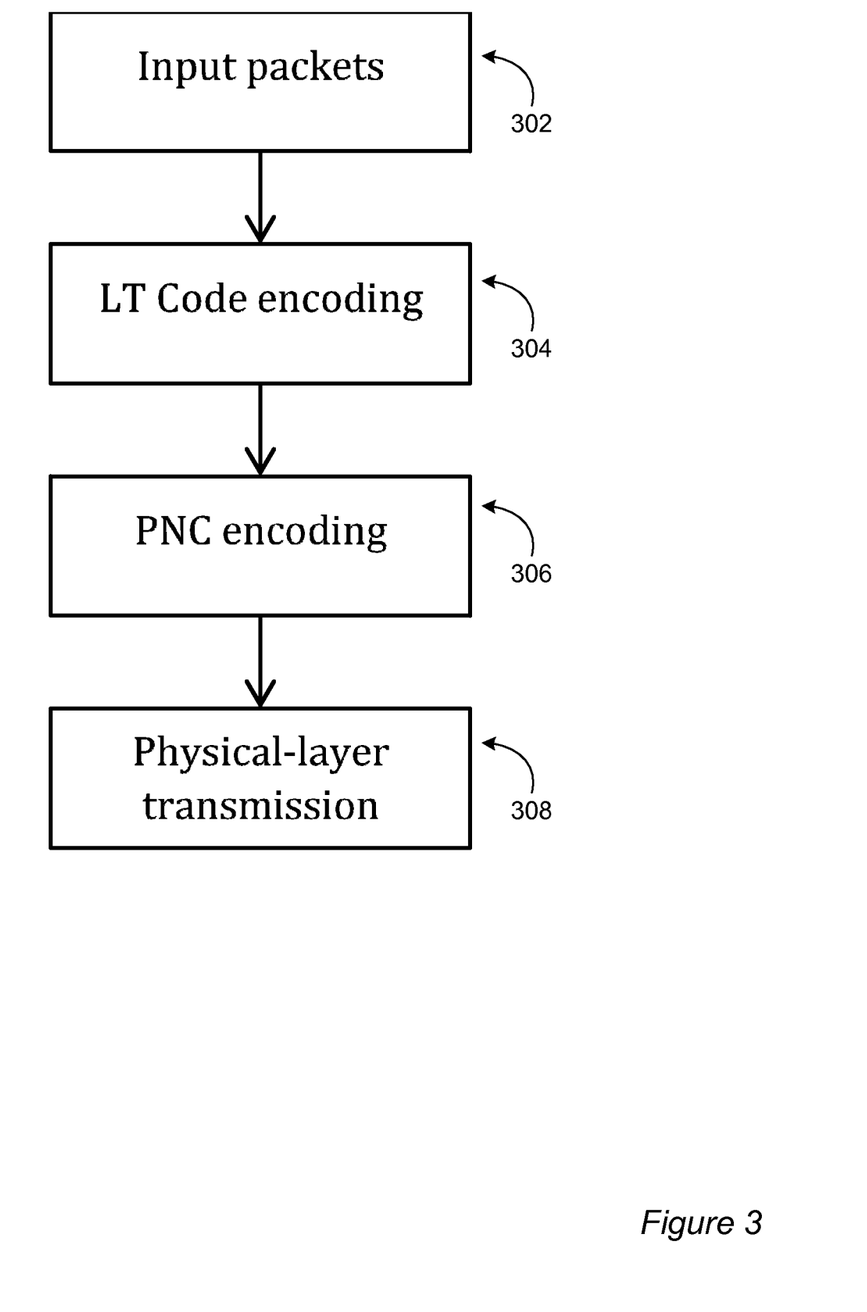
FIG. 3 is a flowchart depicting example operations for encoding in accordance with at least one embodiment of the invention.

Consider a scheme based on network-coded multiple access (NCMA) with fountain codes. For example, fix two positive integers L and T. Let $\Theta$ be an ordered set of L symbols (e.g., A, B, C, and so on). Consider an NCMA system with L source nodes (users), each of which is labelled by a symbol in $\Theta$. Fix a finite field $F_q$ of q elements, called the base field and a degree m extension field $F_{q^m}$. For $s \in \Theta$, source node s has Ks input packets, called the s-input packets. The packets may be regarded as column vectors of T symbols in $F_{q^m}$. Each source node s encodes its input packets using an LT code with degree distribution $\Psi s = (\Psi s[i], i=1, \ldots, D)$, where D is the maximum degree. To encode the s-input packets, the LT-code encoder first obtains a degree d by sampling the degree distribution $\Psi s$ and then combines d packets chosen uniformly at random from all the s-input packets into a coded packet. The generated packet is called an s-coded packet. The s-coded packets are generated independently. This encoding process is illustrated in FIG. 3. At 302, input packets may be received. At 304, LT-code encoding may be performed on the input packets. At 306, physical-layer code (PNC) encoding may be performed on the LT-code encoded data packets. At 308, the appropriately encoded data packets may be transmitted over the physical-layer (e.g., a wireless communication channel).

Figure 4:
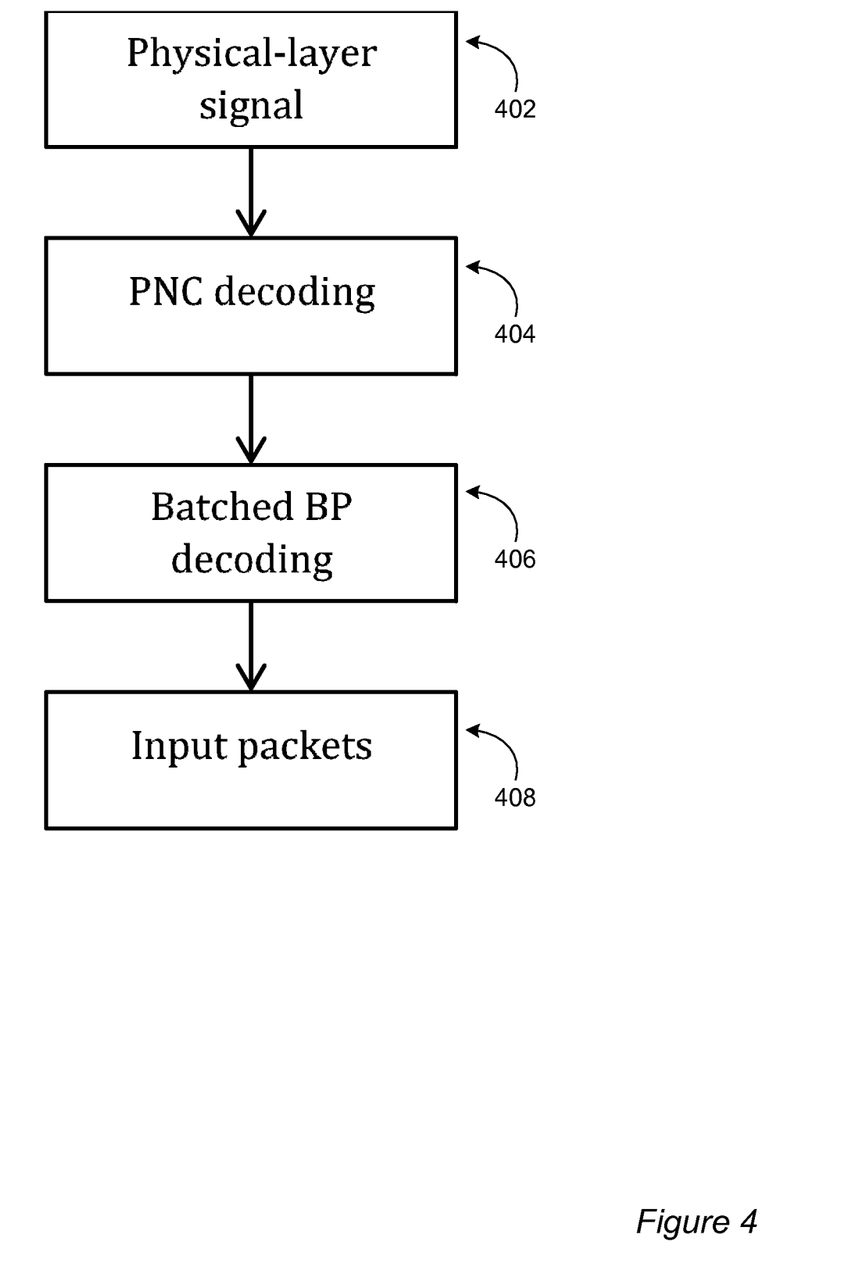
FIG. 4 is a flowchart depicting example operations for decoding in accordance with at least one embodiment of the invention.

The source nodes may transmit the coded packets simultaneously using a common communication channel (e.g., a wireless communication channel). Let $v_s$ be the coded packet transmitted by the source node s, $s \in \Theta$, in a timeslot. The physical-layer decoder of the sink node tries to decode multiple linear combinations of $v_s$, $s \in \Theta$ with coefficients over the base field $F_q$. Suppose that B linearly independent combinations (called output packets) are decoded (B may vary from timeslot to timeslot). These output packets can be expressed as $$[v_s, s \in \Theta] H = [u1, \ldots, uB], \qquad \text{Equation (1)}$$

where H is an L×B matrix over $F_q$, called the transfer matrix, and $[v_s, s \in \Theta]$ is the matrix formed by juxtaposing the vectors $v_s$, where $v_{s'}$ comes before $v_{s''}$ whenever $s' \leq s''$. Denote the set of output packets $\{u1, \ldots, uB\}$ decoded in a timeslot as a batch. Different batches may have different transfer matrices. This decoding process is illustrated in FIG. 4. At 402, a physical-layer signal may be received. At 404, physical-layer decoding may be performed on the received signal. At 406, batched belief propagation (BP) decoding may be performed on the data packets obtained from the physical-layer decoding of 404. At 406, the input packets (e.g., the input packets of 302 of FIG. 3) may be output by the batched belief propagation decoding of 406. An output packet is called a clean packet, or an s-output packet if it is an s-coded packet for certain $s \in \Theta$. An output packet u is called a coupled output packets if $$u = \sum_{s \in S} v_s$$

for certain $S \subset \Theta$.

Figure 5:
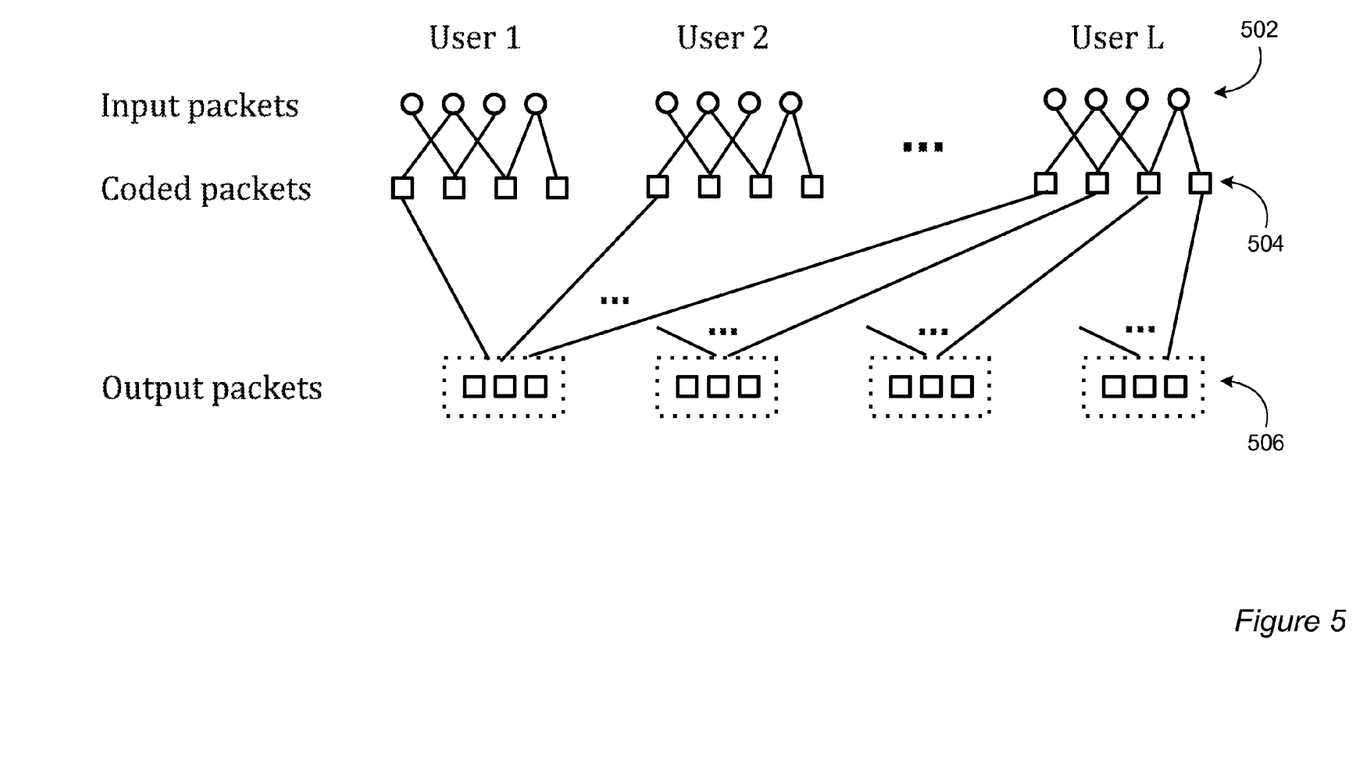
FIG. 5 is a schematic diagram depicting aspects of an example message encoding and decoding utilizing linearly-coupled fountain (LCF) codes in accordance with at least one embodiment of the invention.

In FIG. 5, the coded packets 504 are encoded by each user separately (from input packets 502) and the output packets (of the encoding process) are decoded by the physical layer of the sink node in the batch form (e.g., the combined received packets 506 are decoded). Fix $0 < \eta s < 1$, $s \in \Theta$. For message decoding, we try to recover $\eta s$ fraction of s-input packets for each user s using these output packets.

Precodes can be applied on the original packets of each source node so that recovering a given fraction of the input packets of each source node is sufficient to recover the original input packets. The precodes designed for conventional Raptor codes can be used for our LCF codes. Note that the precodes usually operate on the extension field $F_{q^m}$. It is possible to use LCF codes without precodes.

Conventional belief propagation (BP) decoding of fountain codes can be applied to LCF codes. Conventional BP decoding is not optimal in general, but is described herein for completeness and context. In the conventional decoding algorithm, an output packet of degree one is found, the corresponding input packet is decoded, and the decoded input packet is substituted into the other output packets in which it is involved. The decoding stops when there are no more output packets of degree one.

An example illustrates a case where conventional (or "ordinary") BP decoding is not optimal for LCF codes. Consider a batch of two output packets $u_1 = v_A + v_B$ and $u_2 = v_B + v_C$. Suppose that when the ordinary BP decoding stops, packet $v_A$ is a linear combination of the already-decoded A-input packets, packet $v_B$ has a degree larger than one, and packet $v_c$ has degree one. The ordinary BP decoding substitutes the already-decoded A-input packets in $u_1$ and recovers $v_B$. But since only already-decoded input packets can be substituted, the ordinary BP decoding does not substitute $v_B$ into $u_2$ to recover $v_C$, and hence the BP decoding cannot be resumed. However, if we allow joint processing of $u_1$ and $u_2$, we can substitute $v_B$ into $u_2$ to obtain $v_C$ and hence the BP decoding can be resumed since $v_C$ has degree one. Difficulties such as these may be overcome with a batched BP decoding algorithm in accordance with at least one embodiment of the invention.

Figure 6:
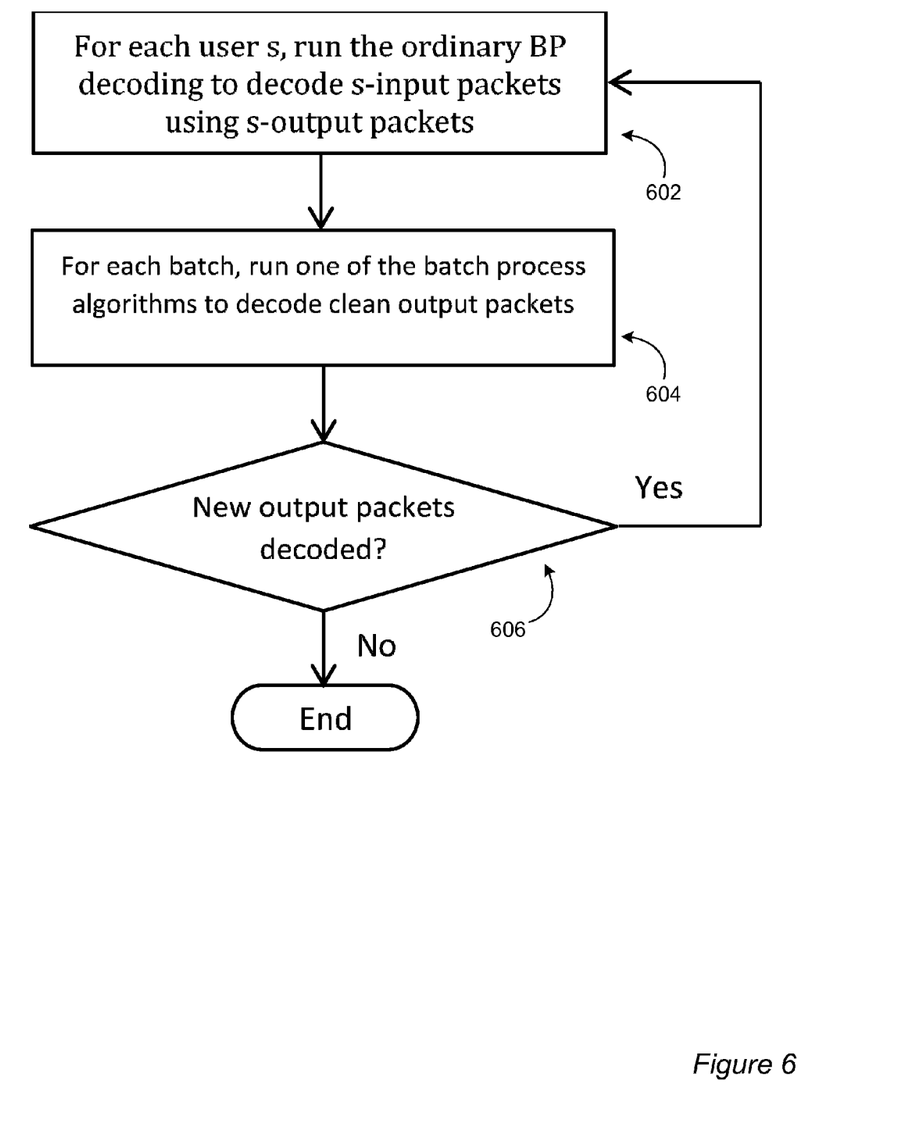
FIG. 6 is a flowchart depicting further example steps for decoding in accordance with at least one embodiment of the invention.

A generic (round-based batched BP) decoder of LCF-L codes may be defined, as well as more specific examples of the generic decoder. The generic decoder of LCF-L codes starts with the first round and each round has at least two stages. In the example illustrated in FIG. 6, the stages include:

Stage 1 (operation 602): The ordinary (e.g., conventional) BP decoding is applied on the s-output packets to decode the s-input packets for each s∈Θ separately. The decoding in the first stage is equivalent to the decoding of LLT codes in parallel. The first stage of the first round uses the clean output packets decoded by the physical layer.

Stage 2 (operation 604): Each batch is processed individually by one of the algorithms to be specified later to recover a number of clean output packets for the next round decoding. When no more clean output packets are recovered than the previous round (test at 606), the decoding stops.

Now the description turns to the examples of the generic decoder in terms of the batch processing algorithms in the second stage, where the linear system of equations in (1) is solved. In the following discussion, we fix S⊂Θ and assume that in (1), the r-input packet vr has been decoded in the first stage if and only if r∈S. We describe three examples of the generic decoder.

A first example of the generic decoder is called the BP-substitution decoder. The i-th row of H is also called the s-th row where s is the i-th symbol in Θ. Denote by $H^S$ the submatrix formed by the rows of H indexed by S. The second stage of the example substitutes the values of vr, r∈S into (1) and obtain $$[v s, s \in \Theta \backslash S] H^{\Theta \backslash S} = [u1, \ldots, uB] - [vr, r \in S] H^S, \quad \text{Equation (2):}$$

where the RHS term is known. Since no further operations are applied to process the above linear system, for certain s∈Θ\S, $v_s$ can be recovered if and only if $H^{\Theta\backslash S}$ has a column where all the components are zero except for the component at the s-th row.

A second example is called the BP-BP decoder, where the ordinary BP algorithm is applied in the second stage. The operation in the second stage includes multiple iterations of the following operations. The first iteration is the same as the algorithm in the second stage of the BP-substitution decoder. For each of the following iterations, the clean output packets recovered in the last iteration are substituted back into (2) and new clear output packets are found (by searching columns of $H^{\Theta\backslash S}$ with only one non-zero component).

A third example is called the BP-GE decoder, where Gaussian (Gauss-Jordan) elimination is applied in the second stage. Specifically, in the second stage of the BP-GE decoder, the substitution in the second stage of the BP-substitution decoder is applied first. Following the substitution, Gaussian elimination transforms $H^{\Theta\backslash S}$ into the reduced column echelon form $\tilde{H}$. We then find the clean output packets by searching columns of $\tilde{H}$ with only one non-zero component. To further reduce the complexity, we can first apply the BP algorithm as in the second stage of the BP-BP decoder and after the BP algorithm stops, apply the Gaussian elimination.

With respect to decoding performance, the packets decoded by the physical layer of the sink node from N timeslots are collectively called a Linearly-Coupled fountain (LCF) code formed by the coupling of L fountain codes, or an LCF-L code, where N is called the block-length of the code. We assume that the empirical distribution of the transfer matrices converges to g, i.e., denoting the transfer matrix of the i-th batch as $H^{(i)}$, as N tends to infinity $$\frac{|\{i : 1 \leq N, H^{(i)} = H\}|}{N} \to g(H),$$

where the domain of g is the collection of all the full-column-rank, L-row matrices over $F_q$ (note: this includes an empty matrix when nothing is decoded).

In accordance with at least one embodiment of the invention, batched BP decoding consistently achieves a rate above 95% of the optimal value, while the performance of conventional BP decoding decreases significantly in several scenarios of practical interest.

Now consider an encoding/decoding scheme suitable for network-coded slotted ALOHA (NCSA). For example, fix a base field $F_q$ with q elements and an integer m>0, and consider a wireless multiple-access network where L source nodes (users) deliver information to a sink node through a common wireless channel. Supposed each user has one input packet for transmission, formulated as a column vector of T symbols in the extension field $F_{q^m}$.

The users are synchronized to a frame consisting of n timeslots of the same duration. The transmission of a packet starts at the beginning of a timeslot, and the timeslots are long enough for completing the transmission of a packet. Each user transmits a number of copies of its input packet within the frame. The number of copies transmitted by a user, called the degree of the packet, is picked independently according to a degree distribution A=(A1, . . . , AD), where D is the maximum degree. With probability Ad, a user transmits d copies of its input packet in d different timeslots chosen uniformly at random in the frame.

Denote by $v_i$ the input packet of the i-th user. Fix a timeslot. Let Θ be the set of indices of the users who transmit a packet in this timeslot. The elements in Θ are ordered by the natural order of integers. Assume that a certain PNC scheme is applied, so that the physical-layer decoder of the sink node can decode multiple output packets, each being a linear combination of $v_s$, s∈Θ with coefficients over the base field $F_q$. Suppose that B output packets are decoded (B may vary from timeslot to timeslot). The collection of B linear combinations can be expressed as $$[vs, s \in \Theta] H = [u1, \ldots, uB], \quad \text{Equation (3):}$$

where H is a |Θ|×B full-column-rank matrix over $F_q$, called the transfer matrix, and [$v_s$, s∈Θ] is the matrix formed by juxtaposing the vectors $v_s$, where $v_{s'}$ comes before $v_{s''}$ whenever s'<s". Call the set of packets {u1, . . . , uB} decoded in a timeslot a batch. The cardinality of Θ (the number of users transmitting in a timeslot) is called the degree of the batch/timeslot.

For multiple access, a goal of the sink node is to decode as many input packets as possible during a frame. From the output packets of the n timeslots decoded by the physical layer, the original input packets can be recovered by solving the linear equations (3) of all the timeslots jointly. Gaussian elimination has a complexity $O(L^3+L^2T)$ finite-field operations when $n=O(L)$, which makes the decoding less efficient when L is large.

The output packets of all the timeslots collectively can be regarded as a low-density generator matrix (LDGM) code. Similar to decoding an LT code, which is also a LDGM code, we can apply the ordinary BP algorithm to decode the output packets. However, as shown in the next example, the ordinary BP decoding cannot decode some types of batches efficiently. In accordance with at least one embodiment of the invention, we can do better than the ordinary BP decoding with little increase of decoding complexity by exploiting a batch structure of the output packets.

For example, consider a batch of two packets $u_1$ and $u_2$ formed by $$[u_1 \quad u_2] = [v_1 \quad v_2 \quad v_3 \quad v_4] \begin{bmatrix} 1 & 0 \\ 0 & 1 \\ 1 & 1 \\ 1 & 1 \end{bmatrix}. \qquad \text{Equation (4)}$$

Suppose that we use the ordinary BP decoding algorithm, and when the BP decoding stops, $v_1$ is recovered by processing other batches, but $v_2$, $v_3$ and $v_4$ are not recovered. However, if we allow the decoder to solve the linear system (4), we can further recover $v_2=u_2-u_1+v_1$. The example shows that the BP decoding performance can be improved if the linear system associated with a timeslot can be solved locally.

Figure 7:
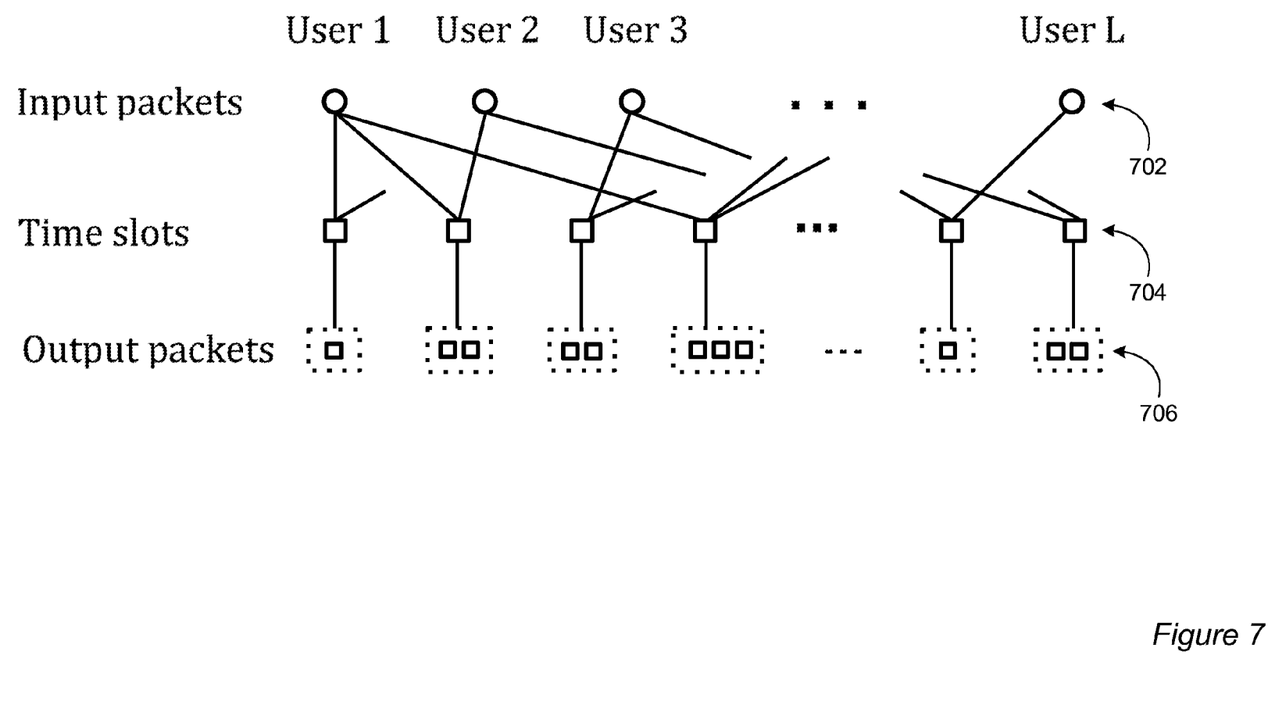
FIG. 7 is a schematic diagram depicting aspects of an example network-coded slotted ALOHA (NCSA) coding scheme in accordance with at least one embodiment of the invention.

The batched BP decoder may be applied to the output packets of the physical layer of NCSA. Although this decoding algorithm is a special case of the generic batched BP decoder, the algorithm can be described in a different way for NCSA. FIG. 7 illustrates the how output packets 706 are generated from input packets 702 utilizing timeslots 704 in NCSA. The batched BP decoder includes multiple iterations. In the i-th iteration of the decoding, $i=1, 2, \ldots$ all the batches are processed individually by the following algorithm: Consider a batch given in (3). Let $S \subset \Theta$ be the set of indices r such that vr is decoded in the previous iterations. When $i=0$, $S=\varnothing$. Let $i:\Theta \to \{1, \ldots, |\Theta|\}$ be the one-to-one mapping preserving the order on $\Theta$, i.e., $i\Theta(s1) < i\Theta(s2)$ if and only if $s1 < s2$. We also write i(s) when $\Theta$ is clear from the context. The algorithm first substitutes the values of vr, $r \in S$ into (3) and obtain $$[vs, s \in \Theta \setminus S]H^{i[\Theta \setminus S]} = [u1, \ldots, uB] - [vr, r \in S]H^{i[S]}, \qquad \text{Equation (5):}$$

where $H^{i[S]}$ is the submatrix of H formed by the rows indexed by i[S]. The algorithm then applies Gaussian (Gauss-Jordan) elimination on the above linear system so that $H^{i[\Theta \setminus S]}$ is transformed into the reduced column echelon form $\tilde{H}$ and (5) becomes $$[\tilde{u}1, \ldots, \tilde{u}B] = [vs, s \in \Theta \setminus S]\tilde{H}$$

Suppose that the j-th column of $\tilde{H}$ has only one nonzero component (which should be one) at the row corresponding to user s. The value of $v_s$ is then $\tilde{u}_j$ and hence recovered. The algorithm returns the new recovered input packets by searching the columns of $\tilde{H}$ with only one non-zero component.

For a batch with degree d, the complexity of the above decoding is $O(d^3+d^2T)$. Suppose that L/n is a constant and the maximum degree D does not change with L. Since the degree of a batch converge to the Poisson distribution with parameter $$\frac{L}{n}\sum_i i\Lambda_i,$$

the average complexity of decoding a batch is O(T) finite-field operations. Hence the total decoding complexity is O(LT) finite-field operations.

Compared with the ordinary BP decoding algorithm for low-density generator-matrix codes, this algorithm has better performance and the same order of computational complexity.

Figure 8:
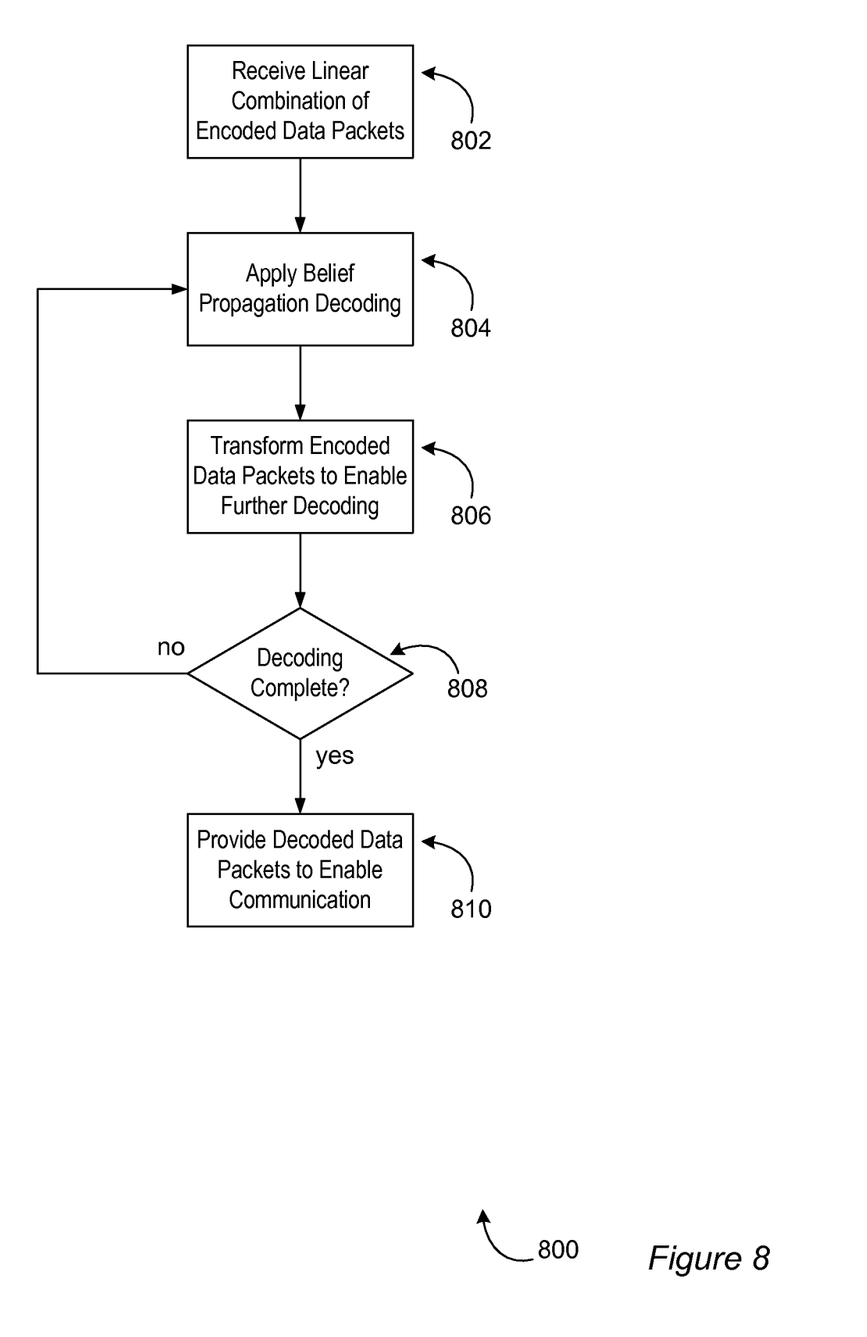
FIG. 8 is a flowchart depicting example operations for decoding in accordance with at least one embodiment of the invention.

FIG. 8 depicts an example procedure 800 for decoding in accordance with at least one embodiment of the invention. At 802, a linear combination of encoded data packets may be received. For example, a decoding component (e.g., decoder 216 of FIG. 2) of a device (e.g., wireless network access point 204) may receive a linear combination of a plurality of encoded data packets transmitted by a plurality of senders in accordance with a fountain code. At 804, belief propagation decoding may be applied to the linear combination of encoded data packets received at 802, for example, as described above with reference to step 602 of FIG. 6. At 806, the encoded and/or partially decoded (collectively, "encoded") data packets output by 804 may be transformed to enable further decoding. For example, the transformation of 806 may enable further applications of belief propagation decoding at 804. In accordance with at least one embodiment, 806 may include a transformation corresponding to a Gaussian reduction of a matrix representing the linear combination of the plurality of encoded data packets. At 808, a determination may be made as to whether the decoding of the encoded data packets received at 802 is complete, for example, as described above with reference to step 606 of FIG. 6. If the decoding is not complete, the multi-stage decoding procedure may be iteratively applied by progressing to 804. If the decoding is complete, the procedure 800 may progress to 810. At 810, the decoded data packets produced by the multi-stage decoding procedure may be provided, for example, to enable communication by the user device 202 of FIG. 2.

Figure 9:
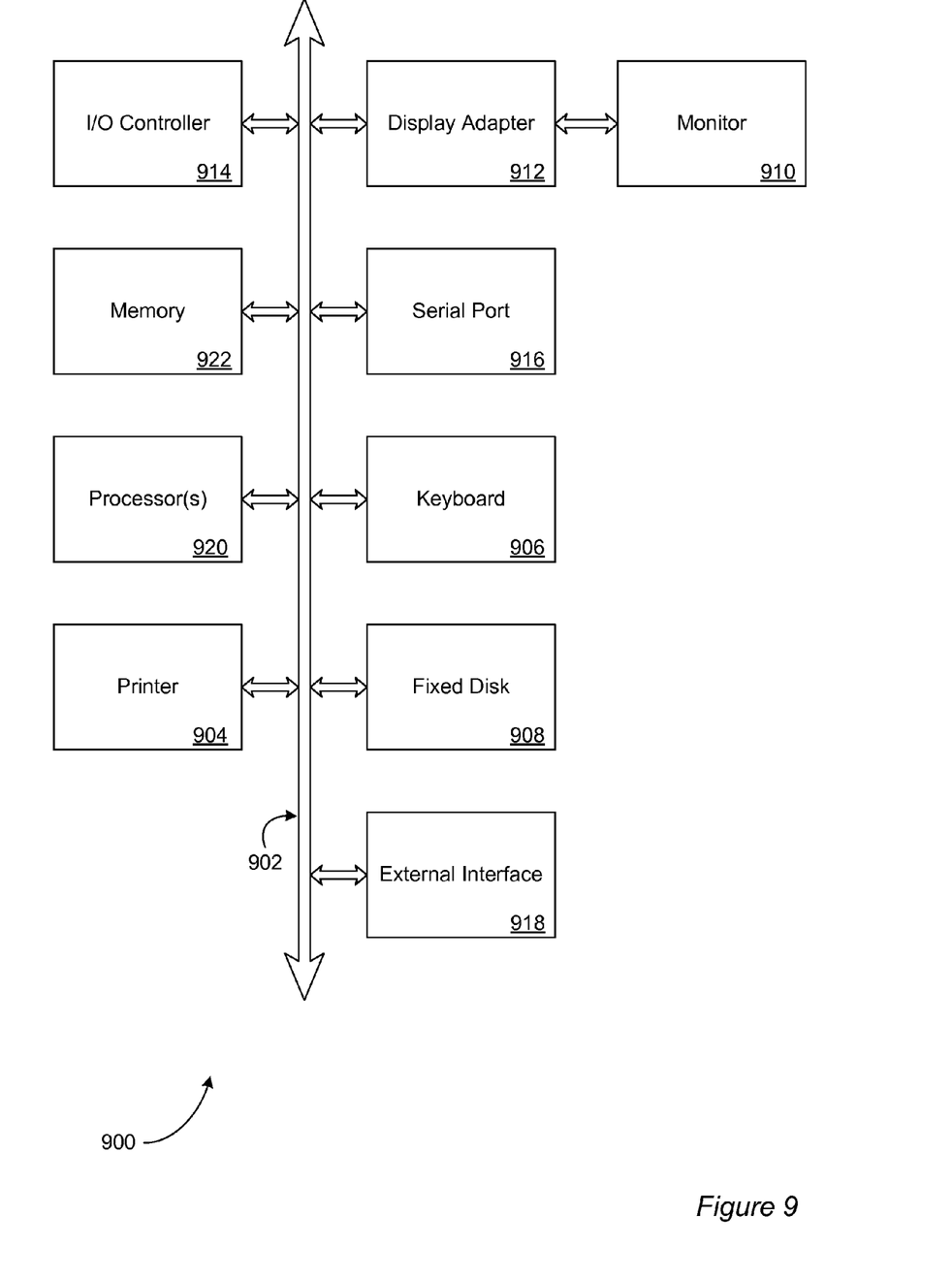
FIG. 9 is a schematic diagram depicting aspects of an example computing device in accordance with some embodiments of the present invention.

In accordance with at least some embodiments, the system, apparatus, methods, processes and/or operations for message coding may be wholly or partially implemented in the form of a set of instructions executed by one or more programmed computer processors such as a central processing unit (CPU) or microprocessor. Such processors may be incorporated in an apparatus, server, client or other computing device operated by, or in communication with, other components of the system. As an example, FIG. 9 depicts aspects of elements that may be present in a computer device and/or system 900 configured to implement a method and/or process in accordance with some embodiments of the present invention. The subsystems shown in FIG. 9 are interconnected via a system bus 902. Additional subsystems such as a printer 904, a keyboard 906, a fixed disk 908, a monitor 910, which is coupled to a display adapter 912. Peripherals and input/output (I/O) devices, which couple to an I/O controller 914, can be connected to the computer system by any number of means known in the art, such as a serial port 916. For example, the serial port 916 or an external interface 918 can be utilized to connect the computer device 900 to further devices and/or systems not shown in FIG. 9 including a wide area network such as the Internet, a mouse input device, and/or a scanner. The interconnection via the system bus 902 allows one or more processors 920 to communicate with each subsystem and to control the execution of instructions that may be stored in a system memory 922 and/or the fixed disk 908, as well as the exchange of information between subsystems. The system memory 922 and/or the fixed disk 908 may embody a tangible computer-readable medium.

The contents of Appendix A and Appendix B may provide additional context and/or details in accordance with at least one embodiment of the invention.

It should be understood that the present invention as described above can be implemented in the form of control logic using computer software in a modular or integrated manner. Alternatively, or in addition, embodiments of the invention may be implemented partially or entirely in hardware, for example, with one or more circuits such as electronic circuits, optical circuits, analog circuits, digital circuits, integrated circuits ("IC", sometimes called a "chip") including application-specific ICs ("ASICs") and field-programmable gate arrays ("FPGAs"), and suitable combinations thereof. In particular, the encoder and/or decoder describe above with reference to FIG. 2 may be partially or entirely implemented in hardware. As will be apparent to one of skill in the art, notions of computational complexity and computational efficiency may be applied mutatis mutandis to circuits and/or circuitry that implement computations and/or algorithms. Based on the disclosure and teachings provided herein, a person of ordinary skill in the art will know and appreciate other ways and/or methods to implement the present invention using hardware and/or a combination of hardware and software.

Any of the software components, processes or functions described in this application may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

All references, including publications, patent applications, and patents, cited herein are hereby incorporated by reference to the same extent as if each reference were individually and specifically indicated to be incorporated by reference and/or were set forth in its entirety herein. Appendix A and Appendix B may provide context and/or additional details with respect to one or more embodiment of the invention described above.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted. Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments of the invention and does not pose a limitation to the scope of the invention unless otherwise claimed. No language in the specification should be construed as indicating any non-claimed element as essential to each embodiment of the present invention.

Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. A method for device-facilitated communication, the method comprising:
receiving, at a decoding component of a device, a linear combination of a plurality of encoded data packets transmitted by a plurality of senders in accordance with a fountain code;
iteratively applying, by the decoding component, a multi-stage decoding procedure to the linear combination of the plurality of encoded data packets to provide decoded data packets corresponding to each of the plurality of senders, the multi-stage decoding procedure including:
a first stage during which a belief propagation decoding of the linear combination of the plurality of encoded data packets is performed; and
a second stage during which the linear combination of the plurality of encoded data packets is transformed to enable further applications of the first stage, wherein at least once among the iterative applications of the multi-stage decoding procedure the second stage includes a transformation corresponding to a Gaussian reduction of a matrix representing the linear combination of the plurality of encoded data packets; and
enabling communication by the senders with the decoded data packets provided by the decoding component.

2. A method in accordance with claim 1, wherein the plurality of encoded data packets is transmitted by the plurality of senders over a common communication channel.

3. A method in accordance with claim 1, wherein the plurality of encoded data packets is transmitted by the plurality of senders in accordance with a network-coded multiple access communication protocol.

4. A method in accordance with claim 1, wherein the linear combination of the plurality of encoded data packets is obtained over a plurality of transmission timeslots and corresponds to a plurality of linear systems of equations, the belief propagation decoding is applied between the linear systems obtained over different timeslots, and the Gaussian reduction is applied locally to solve the linear system associated with each timeslot.

5. A method in accordance with claim 1, wherein the linear combination of the plurality of encoded data packets corresponds to a linear system of equations based at least in part on a transfer matrix for the fountain code and the second stage comprises forming a submatrix of the transfer matrix.

6. A method in accordance with claim 5, wherein the second stage further comprises searching the submatrix for columns or rows having a single non-zero element.

7. A method in accordance with claim 1, wherein the second stage itself comprises an iterative application of a belief propagation decoding of the linear combination of the plurality of encoded data packets.

8. A method in accordance with claim 1, wherein the linear combination of the plurality of encoded data packets corresponds to a linear system of equations and the second stage comprises solving the linear system with Gaussian elimination.

9. A method in accordance with claim 1, wherein a degree distribution utilized for the fountain code is different from a degree distribution designed for a single-user erasure channel.

10. A method in accordance with claim 9, wherein the degree distribution utilized for the fountain code is optimized based at least in part on a number of expected users of a common communication channel.

11. A method in accordance with claim 1, wherein the multi-stage decoding procedure increases a decoding rate of the plurality of encoded data packets compared to utilizing belief propagation decoding alone.

12. A method in accordance with claim 1, wherein the plurality of encoded data packets is transmitted by the plurality of senders in accordance with a network-coded slotted ALOHA communication protocol.

13. A method in accordance with claim 1, wherein the linear combination of the plurality of encoded data packets is obtained over a plurality of transmission timeslots and corresponds to a low-density generator matrix code.

14. A method in accordance with claim 1, wherein the plurality of encoded data packets is transmitted by the plurality of senders over a common wireless communication channel.

15. A method in accordance with claim 14, wherein the plurality of encoded data packets represent a plurality of streams of digital media.

16. A method in accordance with claim 15, wherein the plurality of streams of digital media include at least one of: an audio stream or a video stream.

17. An apparatus for device-facilitated communication, the apparatus comprising:
a network interface configured at least to receive a linear combination of a plurality of encoded data packets transmitted by a plurality of senders in accordance with a fountain code;
a decoding component configured at least to iteratively apply a multi-stage decoding procedure to the linear combination of the plurality of encoded data packets to provide decoded data packets corresponding to each of the plurality of senders, the multi-stage decoding procedure including:
a first stage during which a belief propagation decoding of the linear combination of the plurality of encoded data packets is performed; and
a second stage during which the linear combination of the plurality of encoded data packets is transformed to enable further applications of the first stage, wherein at least once among the iterative applications of the multi-stage decoding procedure the second stage includes a transformation corresponding to a Gaussian reduction of a matrix representing the linear combination of the plurality of encoded data packets; and
at least one circuit or processor configured to collectively facilitate at least the network interface and the decoding component at least in part thereby enabling communication by the apparatus with the decoded data packets provided by the decoding component.

18. A system in accordance with claim 17, wherein the decoding component is incorporated in a wireless communication device.

19. A system in accordance with claim 18, wherein the plurality of encoded data packets is transmitted by the plurality of senders with a plurality of wireless communication devices.

20. One or more non-transitory computer-readable media collectively having thereon computer-executable instructions that configure one or more devices to collectively, at least:
receive a linear combination of a plurality of encoded data packets transmitted by a plurality of senders in accordance with a fountain code;
iteratively apply a multi-stage decoding procedure to the linear combination of the plurality of encoded data packets to provide decoded data packets corresponding to each of the plurality of senders, the multi-stage decoding procedure including:
a first stage during which a belief propagation decoding of the linear combination of the plurality of encoded data packets is performed; and
a second stage during which the linear combination of the plurality of encoded data packets is transformed to enable further applications of the first stage, wherein at least once among the iterative applications of the multi-stage decoding procedure the second stage includes a transformation corresponding to a Gaussian reduction of a matrix representing the linear combination of the plurality of encoded data packets; and
enable communication by the senders with the provided decoded data packets.

* * * * *